United States Patent
Lin et al.

(10) Patent No.: US 9,089,070 B2
(45) Date of Patent: Jul. 21, 2015

(54) INVERTER AND ELECTRONIC DEVICE USING THE INVERTER

(75) Inventors: Han-Hsing Lin, Taoyuan County (TW); Hsiang-Yi Tseng, Taoyuan County (TW); Hsin-Wei Tsai, Taoyuan County (TW); Ching-Hsiang Tien, Taoyuan County (TW); Yi-Lin Chen, Taoyuan County (TW)

(73) Assignee: DELTA ELECTRONICS, INC., Taoyuan County (TW)

( * ) Notice: Subject to any disclaimer, the term of this patent is extended or adjusted under 35 U.S.C. 154(b) by 148 days.

(21) Appl. No.: 13/207,115

(22) Filed: Aug. 10, 2011

(65) Prior Publication Data

US 2012/0273266 A1    Nov. 1, 2012

(30) Foreign Application Priority Data

Apr. 29, 2011   (TW) .............................. 100115027 A

(51) Int. Cl.
*H05K 1/16*     (2006.01)
*H01F 21/00*    (2006.01)
*H01F 27/30*    (2006.01)
*H05K 1/18*     (2006.01)
*H01F 27/32*    (2006.01)
*H01F 27/29*    (2006.01)

(52) U.S. Cl.
CPC .............. *H05K 1/182* (2013.01); *H01F 27/306* (2013.01); *H01F 27/325* (2013.01); *H01F 2027/297* (2013.01); *H05K 2201/1003* (2013.01)

(58) Field of Classification Search
CPC .............................. H01F 27/306; H05K 1/182
USPC .......................................................... 174/260
See application file for complete search history.

(56) References Cited

U.S. PATENT DOCUMENTS

| | | | |
|---|---|---|---|
| 4,857,878 A | 8/1989 | Eng, Jr. et al. | |
| 5,760,669 A * | 6/1998 | Dangler et al. | 336/65 |
| 7,446,637 B1 * | 11/2008 | Liang et al. | 336/65 |
| 7,646,276 B2 * | 1/2010 | Yang et al. | 336/83 |
| 8,102,237 B2 * | 1/2012 | Espino | 336/208 |
| 2003/0067374 A1 * | 4/2003 | Wu | 336/83 |
| 2004/0026123 A1 * | 2/2004 | Park | 174/260 |
| 2007/0024406 A1 | 2/2007 | Hao | |
| 2007/0126542 A1 * | 6/2007 | He et al. | 336/83 |

FOREIGN PATENT DOCUMENTS

| | | |
|---|---|---|
| CN | 1472755 A | 2/2004 |
| CN | 201601001 U | 10/2010 |
| CN | 201754366 U | 3/2011 |

(Continued)

*Primary Examiner* — William H Mayo, III
*Assistant Examiner* — Hiram E Gonzalez
(74) *Attorney, Agent, or Firm* — Muncy, Geissler, Olds & Lowe, P.C.

(57) ABSTRACT

An inverter and an electronic apparatus using the inverter are disclosed. The electronic apparatus has a circuit board and an inverter. The circuit board has an opening. The inverter has a wiring frame arranged in the opening. The wiring frame has a wiring portion for wiring coils. The wiring portion has two carrying portions at opposite sides, respectively. Each of the carrying portions has a side portion. A space for accommodating magnet is formed by the wiring portion and the carrying portion and the side portion. A conductive contact is arranged at one side of the side portion and a protrusion is arranged at another side of the side portion. The protrusion is used for being against the surface of the circuit board, and the height of the inverter with respect to the circuit board can thus be adjusted by the protrusion.

17 Claims, 7 Drawing Sheets

(56) References Cited

FOREIGN PATENT DOCUMENTS

| | | | |
|---|---|---|---|
| JP | 2000-208336 A | 7/2000 | |
| TW | M278044 U | 10/2005 | |
| TW | 200820276 A | 5/2008 | |

* cited by examiner

INVERTER AND ELECTRONIC DEVICE USING THE INVERTER

BACKGROUND OF THE INVENTION

1. Field of the Invention

The disclosure of the present invention relates to an inverter, in particularly to an inverter capable of adjusting its height with respect to the circuit board.

2. Description of Related Art

Inverter is used for transforming external electrical power into working electrical voltage needed by circuit boards of electronic devices. Thus, the inverter is an important component for most of the electronic devices.

While conventional inverter having an E-shaped magnet is operating, external electrical power will be inputted into the inverter and is transformed into working voltage for the electronic device. Since the inverter is standingly welded onto the circuit board and has a certain height over the circuit board, the thickness and size of the electronic device will be increased. That makes the electronic device not easy to carry.

As technology keeps improving, many electronic devices follow the trend towards downsizing. The electronic devices can be downsized and easy to carry. As FIG. 1 shows, a wiring frame of an inverter used in the electronic device is designed to a horizontal structure. The horizontal structure can decrease the height of the inverter over the circuit board. However, the height of the inverter over the circuit board is still high, and the layout block area on the circuit board is still large.

SUMMARY OF THE INVENTION

Therefore, the main objective of the present invention is to solve the abovementioned problem. A plurality of protrusions arranged at the wiring frame of the inverter can be used to adjust the relative height of the inverter with respect to the circuit board. Thus, the thickness of the electronic device can be decreased. And the electronic devices can be more compact and easier for users to carry.

For achieving the above objective, the present invention provides an inverter mainly comprising a wiring frame. The wiring frame has wiring portion, two carrying portions connected to two ends of the wiring portion respectively, and two side portions connected to two ends of each of the carrying portions. The wiring portion has a through hole. Each of the side portions has a protrusion.

The present invention also provides an electronic apparatus comprising an abovementioned inverter and a circuit board. The inverter has a wiring frame. The wiring frame has wiring portion, two carrying portions connected to two ends of the wiring portion respectively, and two side portions connected to two ends of each of the carrying portions. The wiring portion has a through hole. Each of the side portions having a protrusion. The circuit board has an opening passing through the circuit board. The wiring frame is inserted into the opening and the protrusion of the side portion is against the surface of the circuit board.

DETAILED DESCRIPTION OF THE INVENTION

A detailed description of the present invention will be made with reference to the accompanying drawings.

Figure 1:
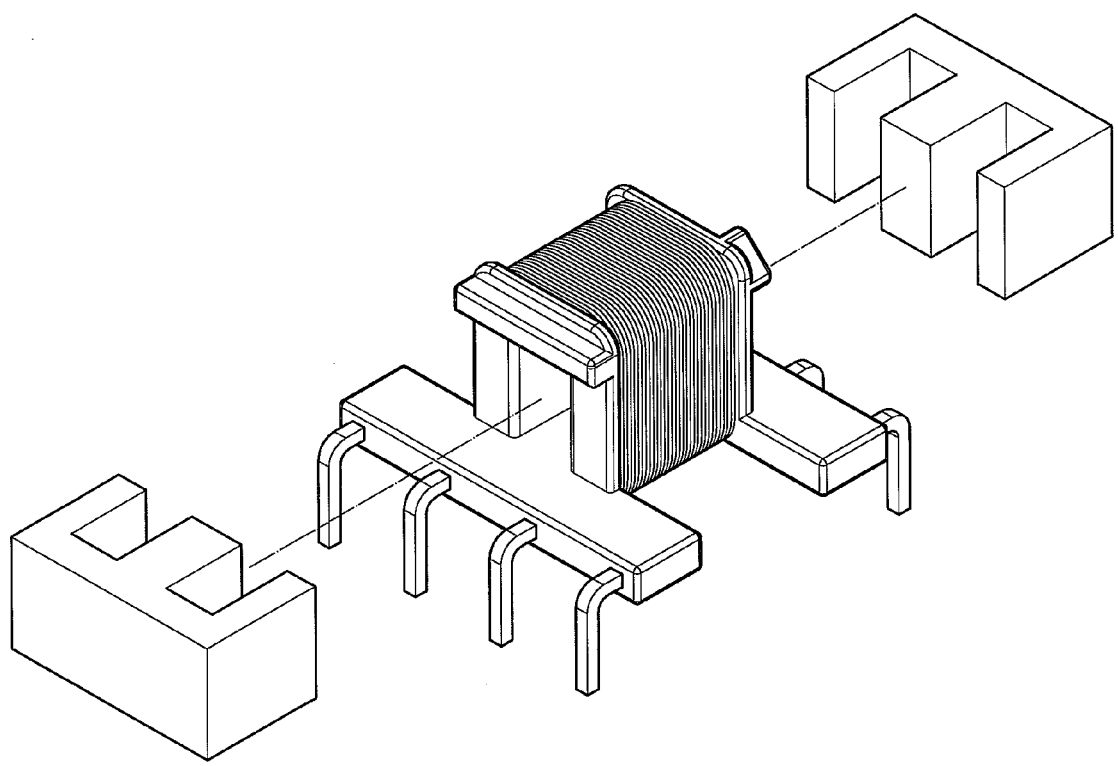
FIG. 1 is a schematic view of the conventional inverter.
Figure 2:
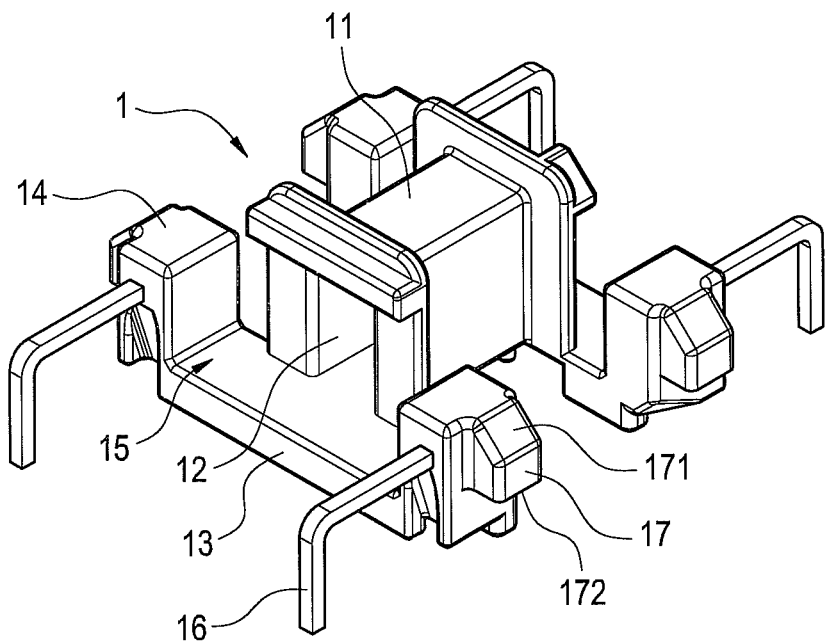
FIG. 2 is a schematic view of a wiring frame of the inverter of the present invention.

FIG. 2 shows a wiring frame of an inverter of the present invention. The inverter has a wiring frame 1. The wiring frame 1 has a wiring portion 11. The wiring portion 11 has a through hole 12. The through hole 12 is for passing a magnet (not shown). Two carrying portions 13 are connected to the two ends of the through hole 12 of the wiring portions 11. Two side portions 14 are connected to the two ends of each of the carrying portion 13. An assembling space 15 is defined by the wiring portion 11 and the carrying portion 13 and side portion 14. A conductive contact 16 is arranged on a side surface of the side portion 14. The conductive contact 16 is for coils of the wiring portion 11 to wire around. The side portion 14 has a protrusion 17 at another side thereof. The protrusion 17 is perpendicular to the conductive contact. The protrusion 17 has an oblique surface 171 and a bottom portion 172. The bottom portion 172 of the protrusion 17 is against the circuit board (not shown).

Figure 3:
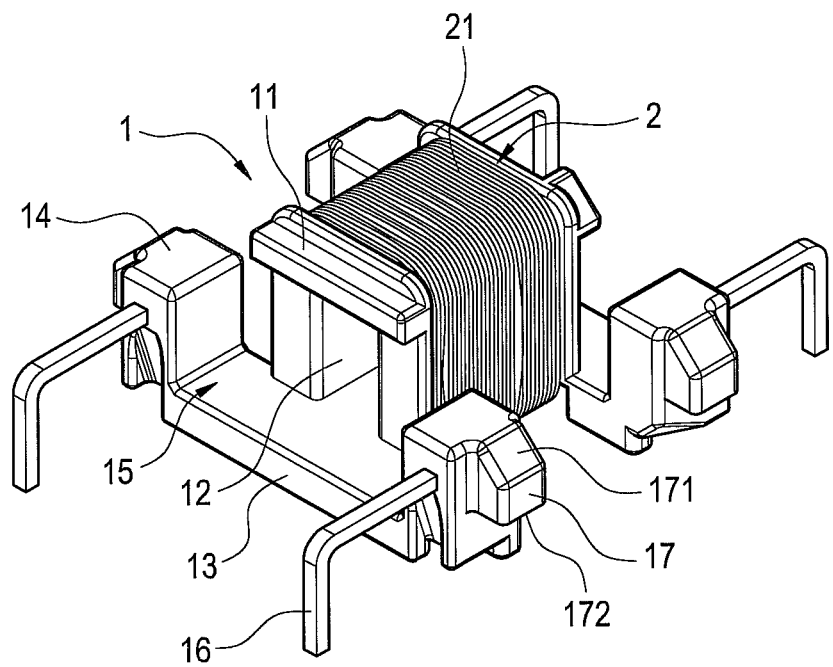
FIG. 3 is a schematic view of the wiring frame of the present invention.

Refer to FIG. 3, a wire 21 made of copper material is wired around the wiring portion 11 of the wiring frame 1 and forms a coil 2. One end of the wire 21 is electrically connected to the conductive contact 16.

Figure 4:
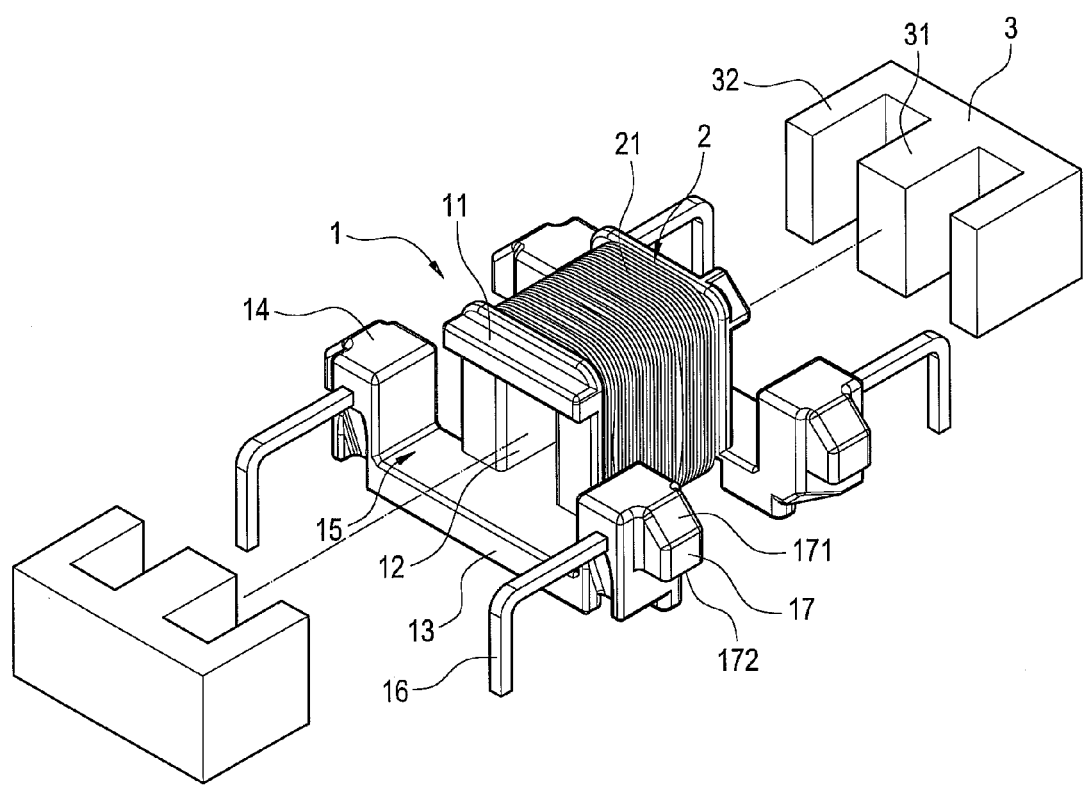
FIG. 4 is an exploded view of the inverter of the present invention.
Figure 5:
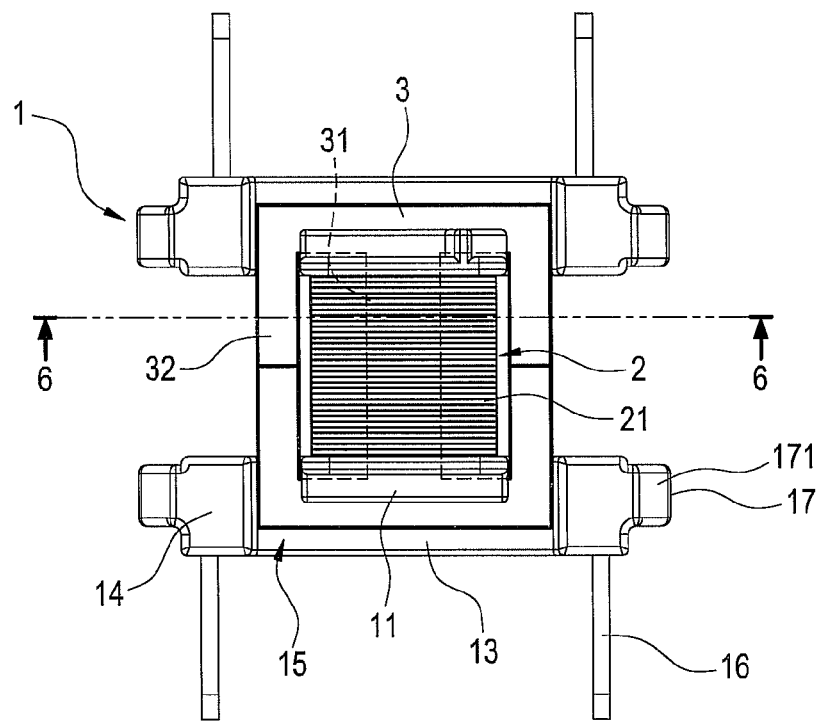
FIG. 5 is a top view of the inverter of the present invention.
Figure 6:
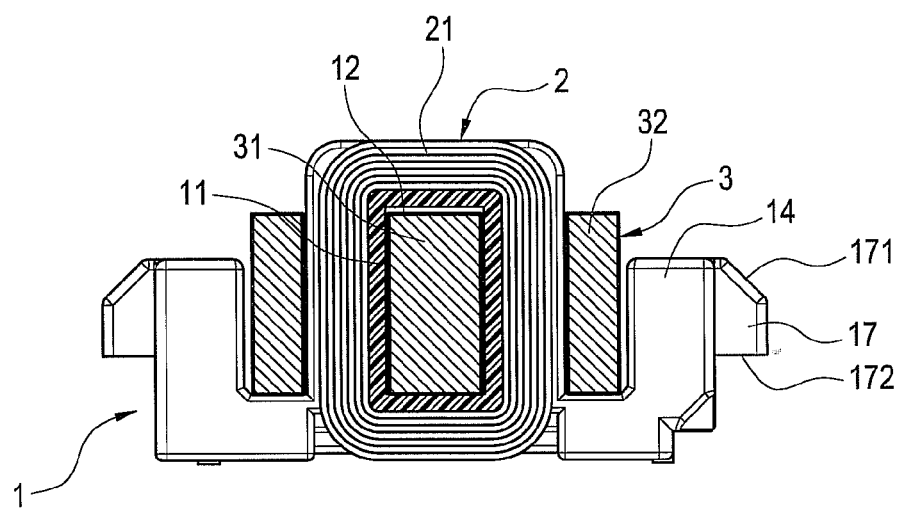
FIG. 6 is a cross sectional view of the inverter of the present invention.

As FIG. 4, FIG. 5 and FIG. 6 show, after the coil 2 is wired around the wiring frame 1, the center post 31 of the magnet 3 is inserted through the through hole 12 of the wiring portion 11. And the side posts 32 of the magnet 3 are respectively inserted into the assembling spaces 15, which are formed by the wiring portion 11 and the carrying portion 13 and the side portion 14. Then, the assembling of the inverter is finished. In this embodiment, the magnet 3 has an E-shaped part and an I-shaped part connected with each other.

Figure 7:
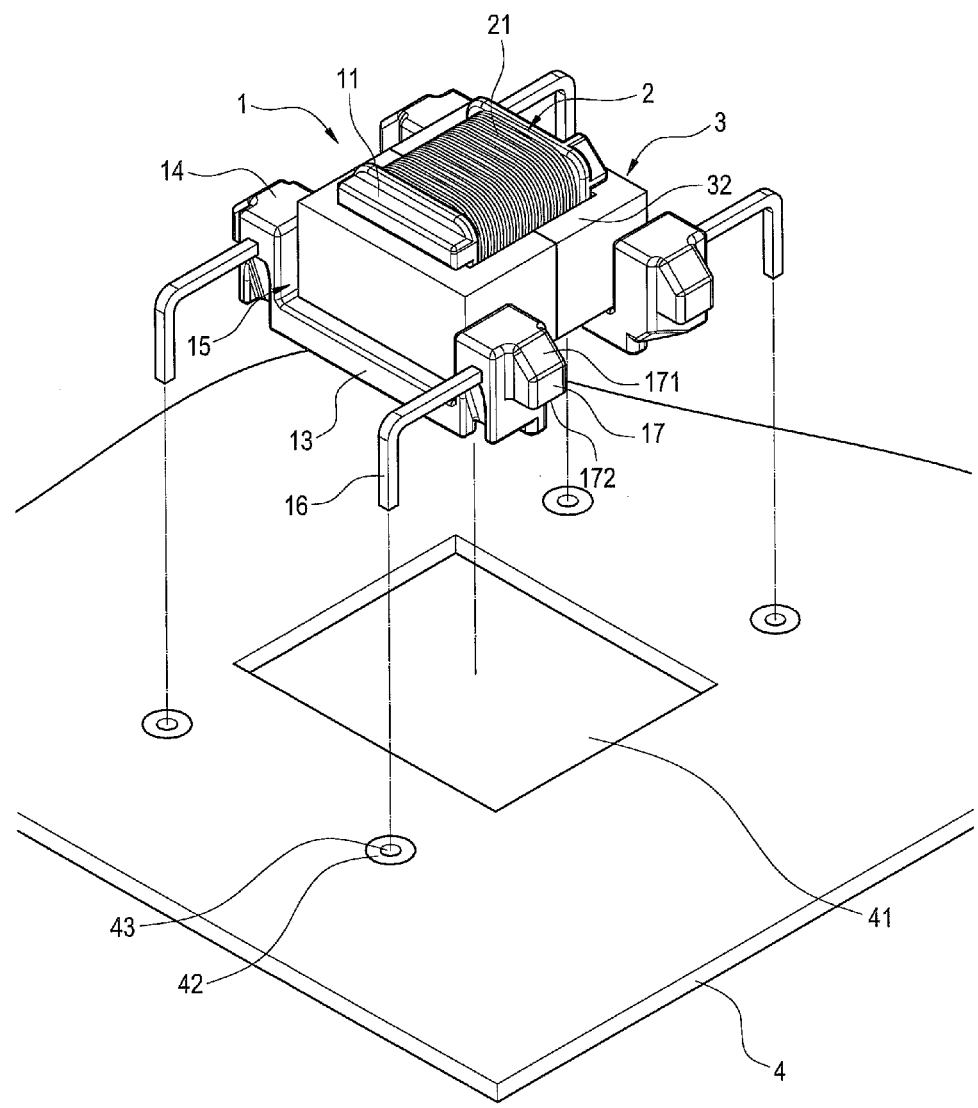
FIG. 7 is an exploded view of the inverter of the present invention.
Figure 8:
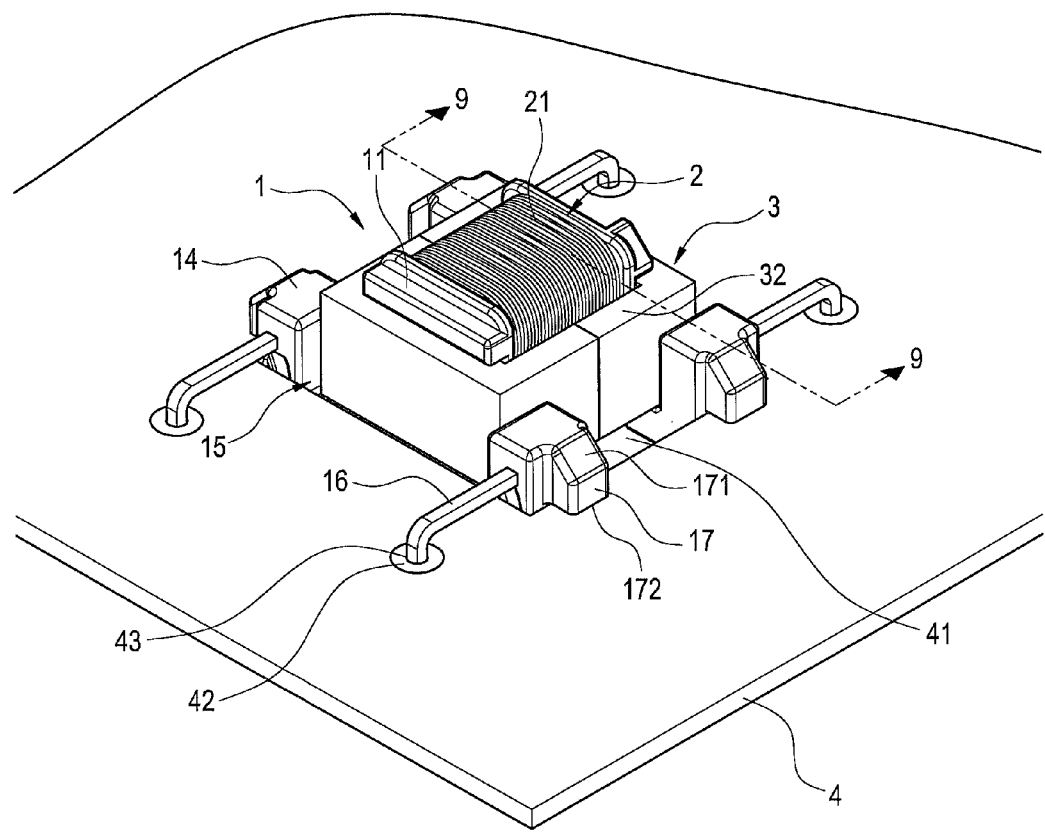
FIG. 8 is a schematic view illustrating the inverter installed on the circuit board.
Figure 9:
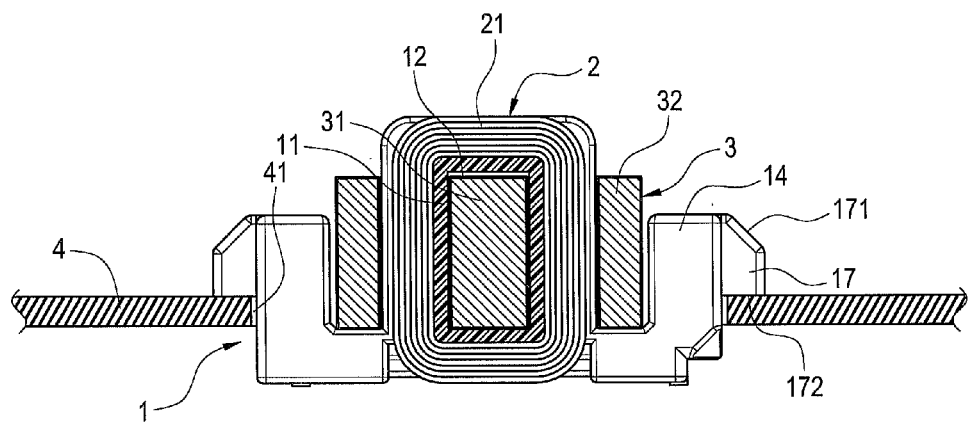
FIG. 9 is a cross sectional view of the inverter of the present invention.

As FIG. 7, FIG. 8 and FIG. 9 show, after the assembling of the inverter is finished, the inverter is to be installed to a circuit board 4. The circuit board 4 has an opening 41. When the inverter is installing, the wiring frame 1 of the inverter passes through the opening 41. The bottom portions 172 of the protrusions 17 of the side portions 14 are against the surface of the circuit board 4. The conductive contacts 16 pass through the copper foil holes 42 on the circuit board 4 and electrically connect to the copper foils 43. Electric current inputted into the circuit board 4 can flow through the conductive contact 16 and to the coil 2. Then, the electric current can output from another end of the conductive contract 16, so that the inverter can perform an electric voltage transformation.

Figure 10:
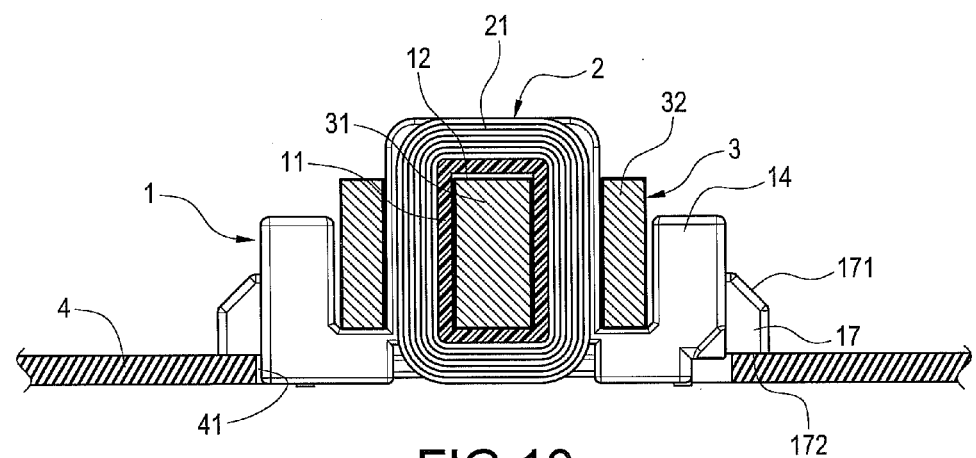
FIG. 10 is a schematic view of the inverter of the present invention.

As FIG. 10 shows, the bottom portions 172 of the protrusions 17 are against the surface of the circuit board 4, the relative height of the wiring frame 1 of the inverter with respect to the circuit board 4 can be decided by the protrusions 17. Thus, if the protrusions 17 change their positions on the side portions 14, the relative height of the inverter with respect to the circuit board 4 can be adjusted to meet the requirement of downsizing for the electronic devices.

Although the present invention has been described with reference to the foregoing preferred embodiments, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A transformer, disposed on a circuit board, the transformer comprising:
   a wiring frame having:
      a wiring portion including a through hole penetrating the wiring portion so as to form two openings at two ends of the wiring portion;
      two carrying portions connected perpendicularly to the two openings of the wiring portion respectively; and
      four side portions connected to two lateral ends of each of the two carrying portions, respectively, the four side portions and the wiring portion being extended upward from top surfaces of the two carrying portions, each of the four side portions having a side surface and at least a part of the side surface being parallel with a side surface of the wiring portion such that the side portions have a separation with the wiring portion to define passageway extended parallel with the through hole and each of the side portions having a protrusion, the protrusion being in one-piece form with the side portion and extending outward from an outer side face of each of the side portions along a direction that is parallel to the circuit board, the protrusion having a bottom portion placed against an upper surface of the circuit board and a lower pal of the side portion is inserted into the opening of the circuit board, and
   a magnet having two side posts, wherein one of the side posts is disposed between the side portion and the wiring portion, wherein the opening of the circuit board is wide enough to receive the side portions such that a relative height of the transformer with respect to the circuit board can be adjusted by changing a location of the bottom portion of the protrusion with respect to a bottom face of the side portion.

2. The transformer according to claim 1, further comprising a coil wired around the wiring portion of the wiring frame.

3. The transformer according to claim 2, wherein the wiring portion, the carrying portion and the side portion define an assembling space.

4. The transformer according to claim 3, wherein the magnet further comprises a center post and the center post passes the through hole of the wiring portion.

5. The transformer according to claim 1, wherein the magnet has two E-shaped parts connected with each other.

6. The transformer according to claim 1, wherein the magnet has an E-shaped part and an I-shaped part connected with each other.

7. The transformer according to claim 1, further comprising a conductive contact arranged at the side portion.

8. The transformer according to claim 7, wherein the protrusion has an oblique surface.

9. An electronic apparatus, comprising:
   a transformer disposed on a circuit board, the transformer comprising:
      a wiring frame having:
         a wiring portion comprising a through hole penetrating the wiring portion so as to form two openings at two ends of the wiring portion;
         two carrying portions connected perpendicularly to the two openings of the wiring portion, respectively; and
         four side portions connected to two lateral ends of each of the two carrying portions, respectively, the four side portions and the wiring portion being extended upward from top surfaces of the two carrying portions, each of the four side portions having a side surface and at least a part of the side surface being parallel with a side surface of the wiring portion such that the side portions have a separation with the wiring portion to define passageway extended parallel with the through hole and each of the side portions having a protrusion, the protrusion being in one piece form with the side portion and extending outward from a side surface of each of the side portions along a direction that is parallel to the circuit board, the protrusion having a bottom portion;
   a magnet having two side posts, wherein one of the side posts is disposed between the side portion and the wiring portion, and
   a circuit board having an opening passing through the circuit board;
   wherein the wiring frame is inserted into the opening and the bottom portion of the protrusion of the side portion is against the surface of the circuit board, wherein the opening of the circuit board is wide enough to receive the side portions such that a relative height of the transformer with respect to the circuit board can be adjusted by changing a location of the bottom portion of the protrusion with respect to a bottom face of the side portion.

10. The electronic apparatus according to claim 9, wherein the transformer further comprises a coil wired around the wiring portion of the wiring frame.

11. The electronic apparatus according to claim 10, wherein the wiring portion, the carrying portion and the side portion define an assembling space.

12. The electronic apparatus according to claim 11, wherein the magnet further comprises a center post and the center post passes the through hole of the wiring portion.

13. The electronic apparatus according to claim 9, wherein the magnet has two E-shaped parts connected with each other.

14. The electronic apparatus according to claim 9, wherein the magnet has an E-shaped part and an I-shaped part connected with each other.

15. The electronic apparatus according to claim 9, wherein the transformer further comprises a conductive contact arranged at the side portion.

16. The electronic apparatus according to claim 15, wherein the protrusion has an oblique surface.

17. The electronic apparatus according to claim 16, further comprising at least one copper foil arranged at the edge of the opening, wherein the copper foil has a hole for the conductive contact to pass through and electrically connect to the copper foil.

* * * * *